(12) United States Patent
Jun et al.

(10) Patent No.: US 7,863,811 B2
(45) Date of Patent: Jan. 4, 2011

(54) ORGANIC LIGHT EMITTING DISPLAY APPARATUS AND METHOD OF MANUFACTURING THE SAME

(75) Inventors: Woo-Sik Jun, Suwon-si (KR); Chul-Kyu Kang, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 484 days.

(21) Appl. No.: 12/051,130

(22) Filed: Mar. 19, 2008

(65) Prior Publication Data

US 2009/0039773 A1 Feb. 12, 2009

(30) Foreign Application Priority Data

Aug. 9, 2007 (KR) .................... 10-2007-0080332

(51) Int. Cl.
*H01J 33/04* (2006.01)
(52) U.S. Cl. .................... 313/504; 313/506; 445/24
(58) Field of Classification Search ......... 313/498–512; 428/690; 445/24–25
See application file for complete search history.

(56) References Cited

U.S. PATENT DOCUMENTS

2004/0124763 A1* 7/2004 Nathan et al. ............... 313/498
2008/0150417 A1* 6/2008 Park ........................... 313/504

FOREIGN PATENT DOCUMENTS

KR 2005-115173 12/2005

* cited by examiner

*Primary Examiner*—Anne M Hines
(74) *Attorney, Agent, or Firm*—Stein McEwen, LLP

(57) ABSTRACT

An organic light emitting display apparatus including: a substrate; a thin film transistor formed on the substrate; a planarization layer formed on the substrate to cover the thin film transistor and comprising a closed-loop groove; a pixel electrode that contacts the thin film transistor and is formed on the planarization layer; a pixel defining layer formed to fill the closed-loop groove; a spacer formed on the planarization layer and disposed outside the pixel electrode; an organic light emitting layer formed on the pixel electrode; and an opposite electrode covering the organic light emitting layer.

20 Claims, 3 Drawing Sheets

ORGANIC LIGHT EMITTING DISPLAY APPARATUS AND METHOD OF MANUFACTURING THE SAME

CROSS-REFERENCE TO RELATED APPLICATION

This application claims the benefit of Korean Application No. 2007-80332, filed Aug. 9, 2007, in the Korean Intellectual Property Office, the disclosure of which is incorporated herein by reference.

BACKGROUND OF THE INVENTION

1. Field of the Invention

Aspects of the present invention relate to an organic light emitting display apparatus and a method of manufacturing the organic light emitting display apparatus. More particularly, aspects of the present invention relate to an organic light emitting display apparatus in which a manufacturing process is simplified and costs for the manufacturing process are reduced and a method of manufacturing the organic light emitting display apparatus.

2. Description of the Related Art

Organic light emitting display apparatuses are self-emitting display devices having an organic light emitting layer between a pixel electrode and an opposite electrode. In such organic light emitting display apparatuses, an anode voltage and a cathode voltage are respectively applied to the pixel electrode and the opposite electrode, and thus holes injected from the pixel electrode are transported to a light emitting layer through a hole transport layer and electrons injected from the opposite electrode are transported to the light emitting layer through an electron transport layer. The transported holes and electrons recombine to generate excitons, and the excitons transfer energy to fluorescent molecules of the light emitting layer while the excitons transition from the excited state to the ground state. Then, the fluorescent molecules emit light to form an image. Organic light emitting display apparatuses are classified into active matrix (AM) types and passive matrix (PM) types. An AM type organic light emitting display apparatus capable of displaying a high quality image has been widely employed.

FIG. 1 shows a schematic cross-sectional view of a conventional AM type organic light emitting display apparatus. Referring to FIG. 1, a conventional organic light emitting display apparatus includes a substrate 10, a buffer layer 11, a semiconductor layer 21, a gate insulating layer 12, a gate electrode 22, an interlevel dielectric layer 13, source and drain electrodes 23 and 24 (the semiconductor layer 21, gate electrode 22, and source and drain electrodes 23 and 24 forming a thin film transistor), a planarization layer 14, a pixel defining layer 15, a spacer 16, a pixel electrode 26, an organic light emitting layer 27 and an opposite electrode 28. The planarization layer 14 is formed to cover the thin film transistor, and a via hole 25, which exposes the drain electrode 24 of the thin film transistor, is formed through the planarization layer 14. A pixel electrode 26 is deposited and patterned on the planarization layer 14 to contact the drain electrode 24 through the via hole 25.

When the pixel electrode 26 is patterned, the pixel defining layer 15, which defines light emitting regions, and the spacer 16, which protects the organic light emitting layer 27, are deposited on the planarization layer 14, and the pixel defining layer 15 and the spacer 16 are patterned to expose the pixel electrode 26.

However, since two masks are used to pattern the pixel defining layer 15 and the spacer 16 in a conventional organic light emitting display apparatus, the manufacturing process is complicated, and thus the costs for the manufacturing process are high. Alternatively, the use of a half-tone mask including a semi-penetrating unit in addition to a light blocking unit and a light penetrating unit may simplify the manufacturing process, but this technique may also lead to high costs for the manufacturing process even though only one mask is used, since a half-tone mask is more expensive than a conventional mask.

SUMMARY OF THE INVENTION

Aspects of the present invention provide an organic light emitting display apparatus in which a patterning process using a mask is simplified and costs for the manufacturing process are reduced and a method of manufacturing the organic light emitting display apparatus.

According to an embodiment of the present invention, there is provided an organic light emitting display apparatus comprising: a substrate; a thin film transistor formed on the substrate; a planarization layer formed on the substrate to cover the thin film transistor and comprising a closed-loop groove; a pixel electrode that contacts the thin film transistor and is formed on the planarization layer; a pixel defining layer formed to fill the closed-loop groove; a spacer formed on the planarization layer and disposed outside the pixel electrode; an organic light emitting layer formed on the pixel electrode; and an opposite electrode covering the organic light emitting layer.

According to an aspect of the present invention, the closed-loop groove may have a rectangular closed-loop shape.

According to an aspect of the present invention, the spacer may be formed along a lengthwise direction of the closed-loop groove.

According to an aspect of the present invention, the spacer may be formed along a transverse direction of the closed-loop groove.

According to an aspect of the present invention, the organic light emitting display may also include a via hole that exposes a source electrode or drain electrode of the thin film transistor, the via hole being inside a perimeter of the closed-loop groove.

According to an aspect of the present invention, the edge of the pixel electrode may be formed inside of the closed-loop groove.

According to an aspect of the present invention, light used to form an image may be emitted towards the opposite electrode.

According to an aspect of the present invention, the pixel defining layer and the spacer may be formed of the same material.

According to an aspect of the present invention, the pixel defining layer and the spacer may be formed of polyimide.

According to an aspect of the present invention, the pixel defining layer and the spacer may be patterned using a single mask.

According to an aspect of the present invention, the planarization layer may be formed of an acryl-based resin.

The organic light emitting display apparatus may further comprise a passivation layer between the thin film transistor and the planarization layer.

According to an aspect of the present invention, the planarization layer, the pixel defining layer and the spacer may be formed of the same material.

According to an aspect of the present invention, the organic light emitting display apparatus may further comprise a buffer layer on the substrate.

According to another embodiment of the present invention, there is provided method of manufacturing an organic light emitting display apparatus, the method comprising: forming a thin film transistor on a substrate; forming a planarization layer on the substrate to cover the thin film transistor; patterning the planarization layer to form a closed-loop groove on the planarization layer; patterning a pixel electrode on the planarization layer; coating an insulating material on the planarization layer and the pixel electrode; patterning the insulating material so that a part of the insulating material fills the closed-loop groove and another part of the insulating material is formed outside the pixel electrode on the planarization layer with a predetermined thickness; forming an organic light emitting layer on the pixel electrode; and forming an opposite electrode to cover the organic light emitting layer.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENT

Figure 1:
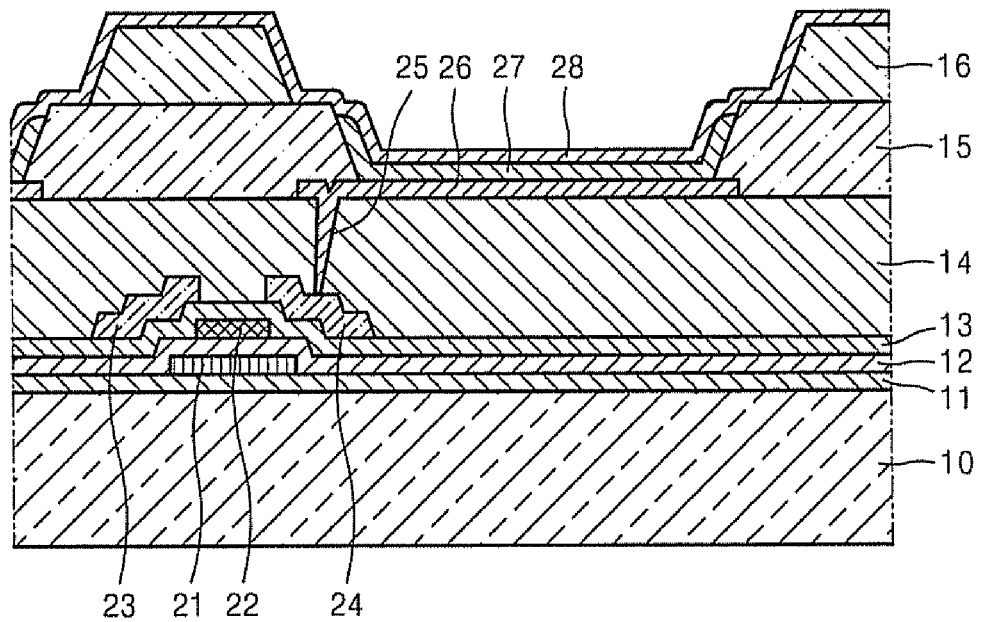
FIG. 1 is a schematic cross-sectional view of a conventional organic light emitting display apparatus.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 2:
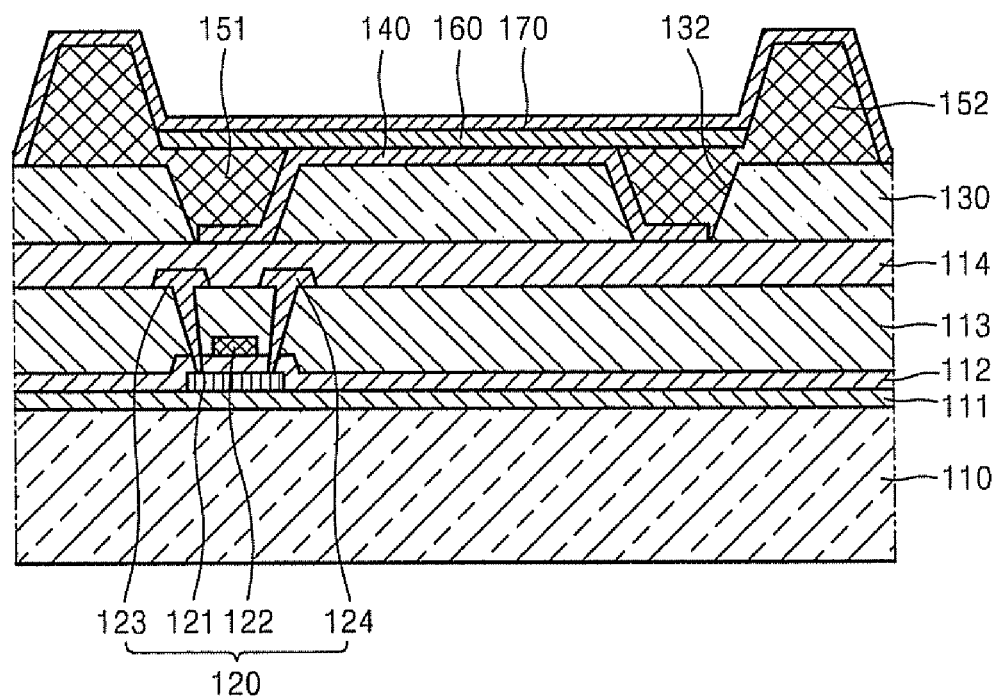
FIG. 2 is a schematic cross-sectional view of an organic light emitting display apparatus according to an embodiment of the present invention.
Figure 3:
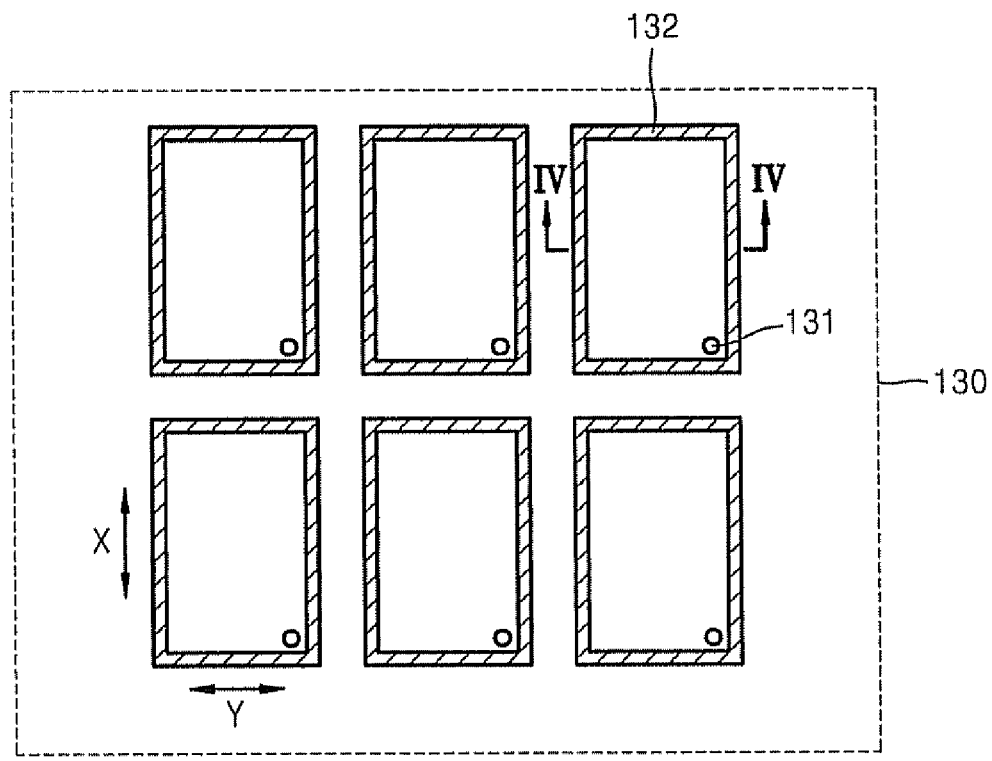
FIG. 3 is a plan view of a plurality of via holes and closed loop-shaped grooves formed outside respective via holes during the forming of a plurality of the organic light emitting display apparatuses of FIG. 2.
Figure 4:
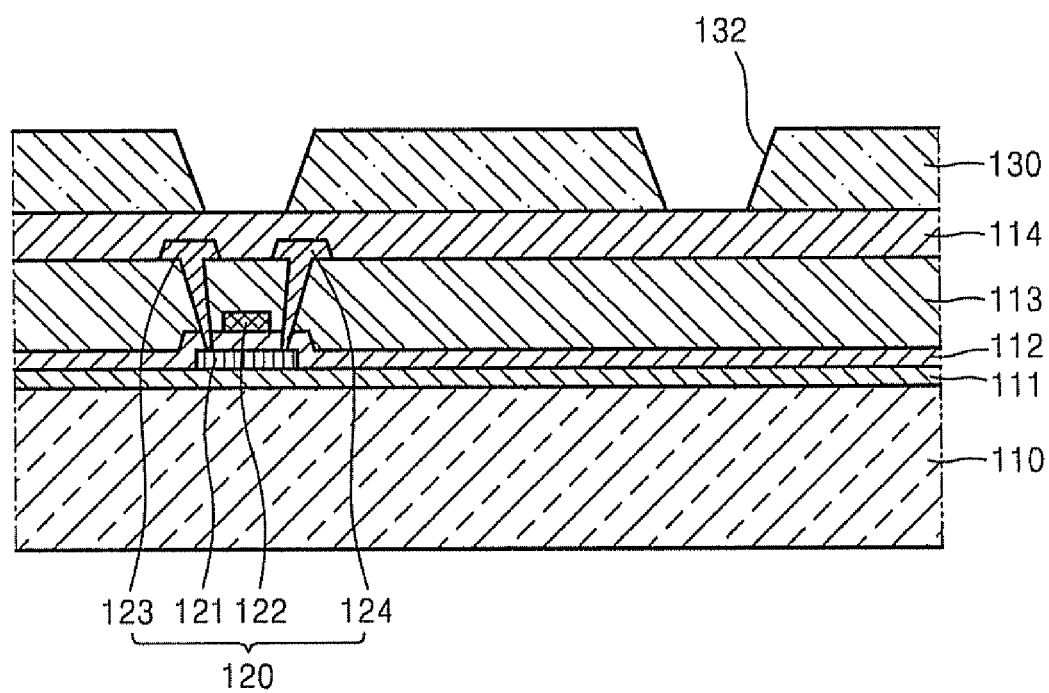
FIG. 4 is a schematic cross-sectional view of FIG. 3 taken along the line IV-IV.
Figure 5:
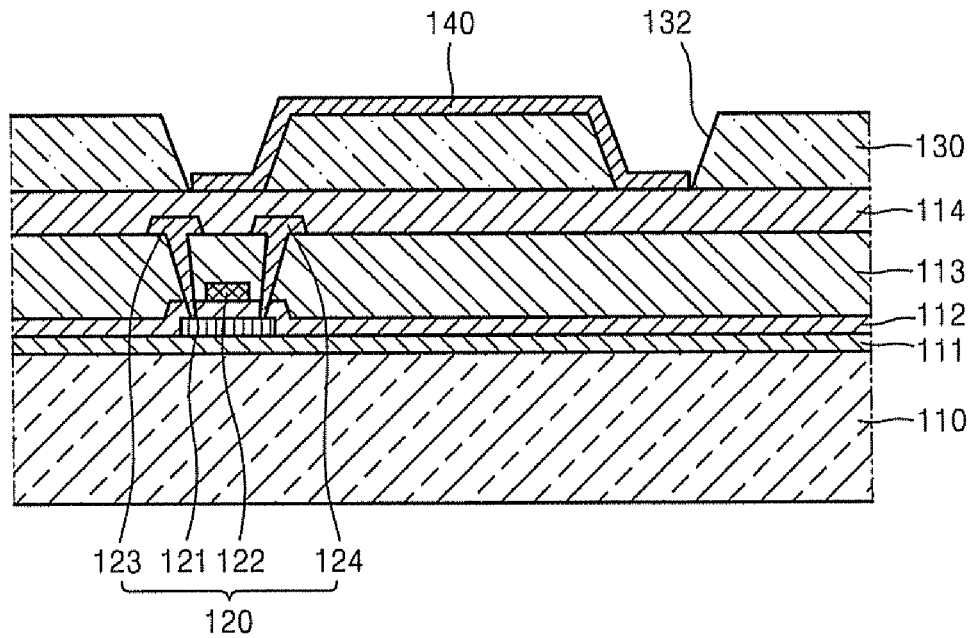
FIG. 5 is a schematic cross-sectional view of a pixel electrode formed on the groove of FIG. 3.
Figure 6:
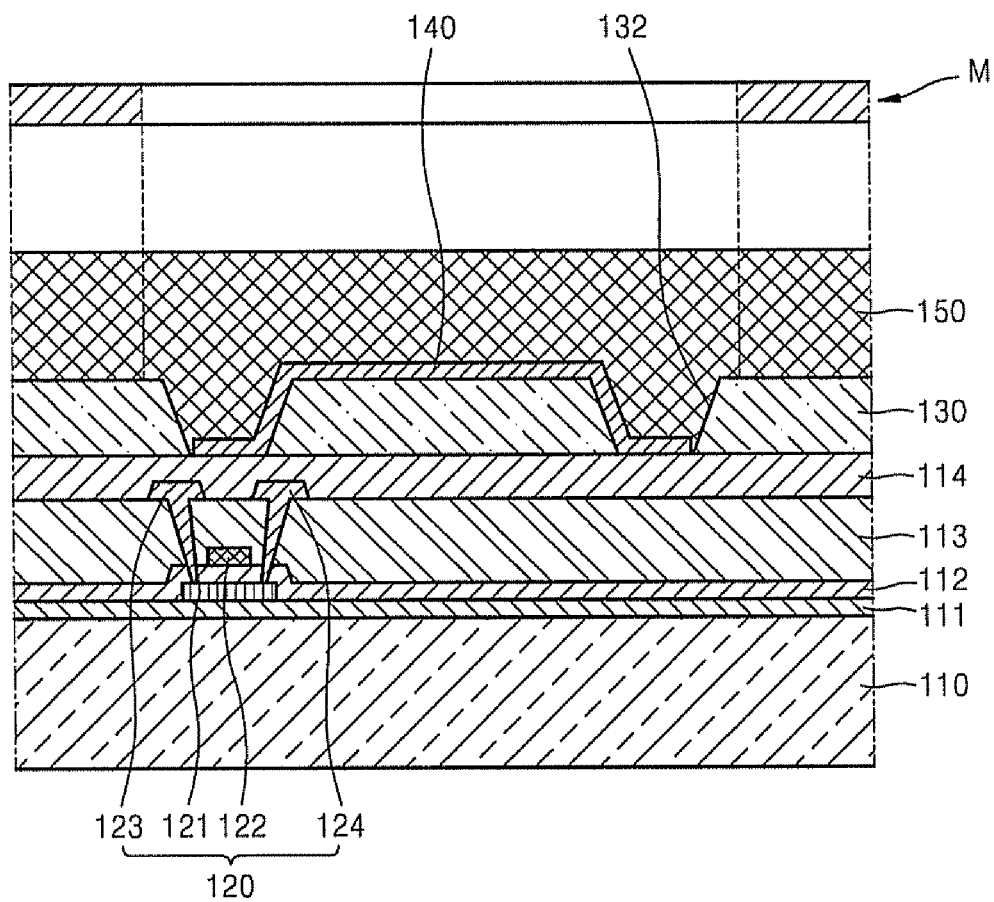
FIG. 6 is a schematic cross-sectional view showing the patterning of a spacer on the structure of FIG. 4.

FIG. 2 is a schematic cross-sectional view of an organic light emitting display apparatus according to an embodiment of the present invention. FIG. 3 is a plan view and FIGS. 4 through 6 are schematic cross-sectional views showing a process of preparing the organic light emitting display apparatus of FIG. 2.

Referring to FIG. 2, an organic light emitting display apparatus according to an embodiment of the present invention includes a substrate 110, a buffer layer 111, a gate insulating layer 112, an interlevel dielectric layer 113, a thin film transistor 120, a passivation layer 114, a planarization layer 130, a pixel electrode 140, a pixel defining layer 151, a spacer 152, an organic light emitting layer 160 and an opposite electrode 170.

The substrate 110 may be formed of a glass material mainly containing $SiO_2$, but is not limited thereto. The substrate may also be formed of various materials such as, for example, a plastic material. The organic light emitting display apparatus depicted in FIGS. 2-6 is a top emission type organic light emitting display device in which an image is displayed in a direction away from the substrate 110. Thus, the substrate 110 is not necessarily transparent. However, an organic light emitting display apparatus according to aspects of the present invention can also be a bottom emission type organic light emitting display device In a bottom emission type organic light emitting display device, the substrate 110 should be formed of a transparent material.

The buffer layer 111 may be formed on the substrate 110 to obtain a smooth surface of the substrate 110 and to inhibit impurities from infiltrating the substrate 110. The buffer layer 111 may be deposited using $SiO_2$ and/or $SiN_x$ by various deposition methods such as plasma enhanced chemical vapor deposition (PECVD), atmospheric pressure chemical vapor deposition (APCVD), low pressure chemical vapor deposition (LPCVD), and enhanced reflectivity coating (ERC). It is to be understood that the buffer layer is not required in every instance.

Where it is described herein that a first layer is "formed on," "deposited on" or "disposed on" a second layer, it is to be understood that the first layer may be formed directly on the second layer or that there may be an intervening layer between the first layer and the second layer.

The thin film transistor 120 is formed on the buffer layer 111 and includes a semiconductor layer 121, a gate electrode 122, a source electrode 123 and a drain electrode 124. The embodiment shown in FIGS. 2-6 is a top gate thin film transistor, but it is to be understood that the present invention is not limited thereto and that the thin film transistor 120 instead may be a bottom gate thin film transistor.

To form the semiconductor layer 121, amorphous silicon is deposited and crystallized The amorphous silicon may be crystallized to polycrystalline silicon through various methods such as, for example, rapid thermal annealing (RTA), solid phase crystallization (SPC), excimer laser annealing (ELA), metal Induced crystallization (MIC), metal Induced lateral crystallization (MILC), and sequential lateral solidification (SLS).

The gate insulating layer 112 is deposited on the crystallized semiconductor layer 121. The gate insulating layer 112 may be formed using an inorganic insulating material such as, for example, $SiN_x$ or $SiO_x$ through a deposition method such as, for example, PECVD, APCVD, LPCVD, ERC, or the like.

The gate electrode 122 is formed on a part of the gate insulating layer 112. The gate electrode 122 is connected to a gate line (not shown), which applies on/off signals of the thin film transistor.

The interlevel dielectric layer 113 is formed on the gate electrode 122, and the source electrode 123 and drain electrode 124 are formed respectively to contact source and drain regions of the semiconductor layer 121 through respective contact holes. The thin film transistor 120 thus formed is covered with the passivation layer 114 to be protected thereby.

An inorganic insulating material and/or an organic insulating material may be used for the passivation layer 114. The inorganic insulating material may include $SiO_2$, $SiN_x$, SiON, $Al_2O_3$, $TiO_2$, $Ta_2O_5$, $HfO_2$, $ZrO_2$, BST, PZT, or the like, and the organic insulating material may include an ordinary polymer such as methylmethacrylate (PMMA) or polystyrene (PS), a polymer derivative having a phenol group, an acryl polymer, an imide polymer, an arylether polymer, an amide polymer, a fluorine polymer, a p-xylene polymer, a vinylalcohol polymer, or a blend of these materials. In addition, the passivation layer 114 may be formed of a complex layer of the inorganic insulating material and the organic insulating material. The passivation layer 114 may be formed independently from the planarization layer 130 which will be described below, but the present invention is not limited thereto. For example, the passivation layer 114 may be formed as a part of the planarization layer 130.

The planarization layer 130 is formed on the passivation layer 114 to protect and planarize the thin film transistor 120 formed thereunder. The planarization layer 130 may have various shapes. The planarization layer 130 may be formed of an organic compound such as benzocyclobutene (BCB) or an acryl-based resin, or an inorganic compound such as $SiN_x$, as a single layer, double layer or multi layer. When the planarization layer 130 is formed as a multi layer, a part of the planarization layer 130 may function as the passivation layer 114.

FIG. 3 is a plan view of a plurality of via holes and closed loop-shaped grooves formed outside respective via holes during the forming of a plurality of the organic light emitting display apparatuses of FIG. 2. Referring to FIGS. 3 and 4, each via hole 131 and closed-loop groove 132 are formed in the planarization layer 130, and each closed-loop groove 132 delineates a pixel of a organic light emitting display apparatus according to an embodiment of the present invention. The via hole 131 electrically connects the drain electrode 124 of the thin film transistor 120 to a pixel electrode 140, which will be described below. The via hole 131 may be disposed at a lower portion of the pixel according to the embodiment shown in FIG. 3, but the present invention is not limited thereto. In particular, the via hole 131 may be located in any suitable position to electrically connect the drain electrode 124 and the pixel electrode.

The closed-loop groove 132 may be rectangular, as shown in FIG. 3, but it is to be understood that other shapes are possible. The via hole 131 is located within the perimeter the closed-loop groove.

A process of forming the via hole 131 and the closed-loop groove 132 is as follows. First, the planarization layer 130 is coated onto the passivation layer 114, and a photoresistor is coated onto the planarization layer 130. The photoresistor is patterned using a mask having predetermined patterns to form the via hole 131 and the groove 132 through a conventional photolithography process. That is, the coated photoresistor is exposed to light, developed, baked, and etched using the mask having the predetermined patterns. Either wet etching or dry etching can be used. When dry etching is used, wet plasma etching, reactive ion etching (RIE), reactive sputter etching, reactive ion beam milling, or the like can be used.

FIG. 5 is a schematic cross-sectional view of a pixel electrode 140 formed on the closed-loop groove 132 of FIG. 3. Referring to FIG. 5, the pixel electrode 140 is formed on the closed-loop groove 132 and the planarization layer 130. The pixel electrode 140 is electrically connected to the source electrode 123 or the drain electrode 124 of the thin film transistor 120 through the via hole 131 shown in FIG. 3. Such a pixel electrode 140 is patterned to have a predetermined pattern on the planarization layer 130 through the photolithography described above.

An opposite electrode 170 is formed on the pixel electrode 140. Typically, the opposite electrode 170 is a cathode connected to an external terminal (not shown) and the pixel electrode 140 is an anode. However, it is to be understood that in some embodiments, the opposite electrode 170 may be an anode and the pixel electrode may be a cathode.

In a top emission type organic light emitting display device, in which an image is displayed in a direction to the opposite electrode 170 as described above, the pixel electrode 140 may be a reflective electrode and the opposite electrode 170 may be a transparent electrode.

The pixel electrode 140 may be prepared as a reflective electrode by forming a reflective layer using Ag, Mg, Al, Pt, Pd, Au, Ni, Nd, Ir, Cr, Li, Ca or a compound thereof, and forming a high work function material such as ITO, IZO, ZnO, or $In_2O_3$ thereon. The opposite electrode 170 may be prepared to be a transparent electrode by depositing a metal having a low work function such as Ag, Mg, Al, Pt, Pd, Au, Ni, Nd, Ir, Cr, Li, Ca or a compound thereof, and forming an auxiliary electrode layer or a bus electrode line using a transparent conductive material such as ITO, IZO, ZnO, or $In_2O_3$.

to the organic light emitting display apparatus according to aspects of the present invention may also be a bottom emission type organic light emitting display apparatus in which an image is displayed through the substrate 110. In such a case, a spacer 152 having a considerable thickness, which is required in the top emission type organic light emitting display apparatus, may not be necessary. In the top emission type organic light emitting display apparatus, the spacer 152 having a considerable thickness is advantageous to inhibit the organic light emitting layer 160 from being directly exposed to external impacts or stimulus. However, such a spacer is not needed in a bottom emission type organic light emitting display apparatus. In a bottom emission type organic light emitting display apparatus, the pixel electrode 140 may be a transparent electrode, and the opposite electrode 170 may be a reflective electrode. The pixel electrode 140 may be formed of a high work function material such as ITO, IZO, ZnO or $In_2O_3$, and the opposite electrode 170 may be formed of a metal having a low work function such as Ag, Mg, Al, Pt, Pd, Au, Ni, Nd, Ir, Cr, Li or Ca.

Further, both of the pixel electrode 140 and the opposite electrode 170 may be transparent in a two-sided emission type organic light emitting display apparatus.

FIG. 6 is a schematic cross-sectional view showing patterning a space on the structure of FIG. 4. Referring to FIG. 6, an insulating material 150 is coated on the planarization layer 130 and the pixel electrode 140 to sufficiently fill the closed-loop groove 132 to a predetermined thickness and to cover a portion of the planarization layer outside the pixel electrode to a predetermined thickness. Polyimide may be used as the insulating material 150.

A photoresistor is coated onto the insulating material 150, and the insulating material 150 is patterned using a mask M using a conventional photolithography process such that a part of the insulating material 150 remains in the closed-loop groove 132 and another part of the insulating material 150 remains on the planarization layer 130 outside the pixel electrode 140 to a predetermined thickness. Here, the predetermined thickness formed outside the pixel electrode 140 may be adjusted by controlling the thickness of the coated insulating material 150.

The insulating material 150 patterned to a predetermined thickness outside the pixel electrode 140 serves as the spacer 152 to prevent pixels from being damaged by external stimulus. The portion of the insulating material 150 filled in the closed-loop groove 132 when the spacer 152 is formed is not etched and remains surrounding the edge of the pixel electrode 140. This portion becomes the pixel defining layer 151. Thus, according to aspects of the present invention, the pixel defining layer 151 and the spacer 152 can be formed using one mask instead of using two different masks or a half-tone mask.

The spacer 152 may be formed along a lengthwise direction (the X direction in FIG. 3) of the closed-loop groove 132, but the present invention is not limited thereto. The spacer 152 may be formed along a transverse direction (the Y direction in FIG. 3) of the closed-loop groove 132. The spacer 152 may also be formed in both of the lengthwise direction (X direction) and the transverse direction (Y direction) of the opening 132, or in a portion of the directions of the groove 132.

Further, it is not necessary for the spacer 152 to be formed at every edge of each closed-loop groove 132. The spacer 152 can be formed at any position outside the pixel electrode 140 to protect the organic light emitting layer 160.

An organic light emitting layer 160 is formed on the pixel electrode 140 after the pixel defining layer 151 and the spacer 152 are formed. The organic light emitting layer 160 emits light during electrical operation of the pixel electrode 140 and the opposite electrode 170 which will be described later. The organic light emitting layer 160 may include a low molecular weight or a polymer organic material. When the organic light emitting layer 160 is formed of a low molecular weight organic material, a hole transport layer (HTL) and a hole injection layer (HIL) may be formed between the organic light emitting layer 160 and the pixel electrode 140, and an electron transport layer and an electron injection layer may be formed between the organic light emitting layer 160 and the opposite electrode 170. Various layers may also further be formed as desired. Various organic materials such as copper phthalocyanine (CuPc), N,N'-di(naphthalene-1-yl)-N,N'-diphenyl-benzidine (NPB), and tris-8-hydroxyquinoline aluminum (Alq3) can be used.

If the organic light emitting layer 160 is formed of a polymer organic material, only the hole transport layer (HTL) may be formed between the organic light emitting layer 160 and the pixel electrode 140. The polymer HTL may be formed on the pixel electrode 140 using poly-(2,4)-ethylene-dihydroxy thiophene (PEDOT) or polyaniline (PANI) by inkjet printing or spin coating. The polymer organic light emitting layer 160 may be formed of PPV, soluble PPV's, cyano-PPV, polyfluorene, or the like, and a color pattern can be formed using a conventional method such as inkjet printing, spin coating or thermal transfer method using a laser.

A sealing member (not shown) or a moisture absorbent (not shown) may be further formed on the opposite electrode 170 to protect the organic light emitting layer 160 from moisture or oxygen.

According to an organic light emitting display apparatus and a method of manufacturing the same according to embodiments of the present invention, the manufacturing process can be simplified by patterning the pixel defining layer 151 and the spacer 152 using a single mask M, and thus costs for the manufacturing process can be reduced. Further, exposed areas of the pixel electrode are increased compared to a conventional organic light emitting display apparatus, and thus the light emitting area of the organic light emitting display apparatus can be increased.

Although a few embodiments of the present invention have been shown and described it would be appreciated by those skilled in the art that changes may be made in this embodiment without departing from the principles and spirit of the invention, the scope of which is defined in the claims and their equivalents.

What is claimed is:

1. An organic light emitting display apparatus comprising:
   a substrate;
   a thin film transistor formed on the substrate;
   a planarization layer formed on the substrate to cover the thin film transistor, and comprising a closed-loop groove;
   a pixel electrode that contacts the thin film transistor and is formed on the planarization layer;
   a pixel defining layer formed to fill the closed-loop groove;
   a spacer formed on the planarization layer and disposed outside the pixel electrode;
   an organic light emitting layer formed on the pixel electrode; and
   an opposite electrode covering the organic light emitting layer.

2. The organic light emitting display apparatus of claim 1, wherein the closed-loop groove is rectangular.

3. The organic light emitting display apparatus of claim 2, wherein the spacer is formed along a lengthwise direction of the closed-loop groove.

4. The organic light emitting display apparatus of claim 2, wherein the spacer is formed along a transverse direction of the closed-loop groove.

5. The organic light emitting display apparatus of claim 1, further including a via hole that exposes a source electrode or drain electrode of the thin film transistor, the via hole being inside a perimeter of the closed-loop groove.

6. The organic light emitting display apparatus of claim 1, wherein the light emitting layer extends over the pixel-defining layer.

7. The organic light emitting display apparatus of claim 1, wherein an edge of the pixel electrode extends into the closed-loop groove.

8. The organic light emitting display apparatus of claim 1, wherein light used to form an image is emitted towards the opposite electrode.

9. The organic light emitting display apparatus of claim 1, wherein the pixel defining layer and the spacer are formed of the same material.

10. The organic light emitting display apparatus of claim 1, wherein the pixel defining layer and the spacer are formed of polyimide.

11. The organic light emitting display apparatus of claim 1, wherein the pixel defining layer and the spacer are patterned using a single mask.

12. The organic light emitting display apparatus of claim 1, wherein the planarization layer is formed of an acryl-based resin.

13. The organic light emitting display apparatus of claim 1, further comprising a passivation layer between the thin film transistor and the planarization layer.

14. The organic light emitting display apparatus of claim 1, wherein the planarization layer, the pixel defining layer and the spacer are formed of the same material.

15. The organic light emitting display apparatus of claim 1, further comprising a buffer layer on the substrate.

16. An organic light emitting display panel comprising a plurality of organic light emitting display apparatuses, each organic light emitting display apparatus comprising:
   a substrate;
   a thin film transistor formed on the substrate;
   a planarization layer formed on the substrate to cover the thin film transistor, and comprising a closed-loop groove;
   a pixel electrode that contacts the thin film transistor and is formed on the planarization layer;

a pixel defining layer formed to fill the closed-loop groove;

a spacer formed on the planarization layer and disposed outside the pixel electrode;

an organic light emitting layer formed on the pixel electrode;

an opposite electrode covering the organic light emitting layer; and a via hole that exposes a source electrode or drain electrode of the thin film transistor, the via hole being inside a perimeter of the closed-loop groove.

17. A method of manufacturing an organic light emitting display apparatus, the method comprising:

forming a thin film transistor on a substrate;

forming a planarization layer on the substrate to cover the thin film transistor;

patterning the planarization layer to form a closed-loop groove in the planarization layer;

patterning a pixel electrode on the planarization layer;

coating an insulating material on the planarization layer and the pixel electrode;

patterning the insulating material so that a part of the insulating material fills the closed-loop groove and another part of the insulating material is formed outside the pixel electrode on the planarization layer with a predetermined thickness;

forming an organic light emitting layer on the pixel electrode; and forming an opposite electrode to cover the organic light emitting layer.

18. The method of claim 17, wherein in the patterning of the pixel electrode on the planarization layer, the pixel electrode is patterned to extend into the closed-loop groove.

19. The method of claim 17, wherein the organic light emitting layer is formed to extend over the insulating material that fills the closed-loop groove.

20. The method of claim 17, wherein the patterning of the insulating material so that a part of the insulating material is formed to fill the closed-loop groove and another part of the insulating material is formed outside the pixel electrode on the planarization layer with a predetermined thickness is carried out by photolithography using a single mask.

* * * * *